United States Patent [19]

Wagner

[11] 4,380,738
[45] Apr. 19, 1983

[54] RF AMPLIFIER APPARATUS

[75] Inventor: Robert S. Wagner, Quincy, Ill.

[73] Assignee: Harris Corporation, Melbourne, Fla.

[21] Appl. No.: 233,059

[22] Filed: Feb. 10, 1981

[51] Int. Cl.³ .............................................. H03F 3/189
[52] U.S. Cl. ..................................................... 330/151
[58] Field of Search ................. 330/126, 151, 302, 306

[56] References Cited

U.S. PATENT DOCUMENTS

| | | | |
|---|---|---|---|
| 3,168,707 | 2/1965 | Levitt et al. | 330/21 |
| 3,434,070 | 3/1969 | Bartink et al. | 330/31 |
| 3,789,314 | 1/1974 | Beurrier | 330/185 |
| 4,028,634 | 6/1977 | Tentarelli | 330/151 |
| 4,048,579 | 9/1977 | Carlson | 330/151 |
| 4,130,807 | 1/1978 | Hall et al. | 330/124 R |

FOREIGN PATENT DOCUMENTS 2618030  10/1977  Fed. Rep. of Germany ...... 330/151

OTHER PUBLICATIONS

Sansui Advertisement, *Stereo Review*, Jan. 1981, pp. 34, 35.

*Primary Examiner*—James B. Mullins
*Assistant Examiner*—Gene Wan
*Attorney, Agent, or Firm*—Yount & Tarolli

[57] ABSTRACT

Apparatus for interconnecting two or more high gain, low input impedance amplifier stages for high gain amplification. A first amplifier stage (12) provides a first amplified signal to a coupling circuit. The coupling circuit (26) divides the power of the first amplified signal between the input to a second amplifier stage (14) and a feed forward path (28). The output of the second amplifier stage is combined with the feed forward portion of the first amplified signal in a signal combiner (30). Embodiments (FIGS. 4, 5) employing more than two amplifier stages are described.

12 Claims, 5 Drawing Figures

RF AMPLIFIER APPARATUS

BACKGROUND AND FIELD OF THE INVENTION

The present invention relates to apparatus for amplifying electrical signals, and more particularly to apparatus for interconnecting plural amplifiers so as to achieve high gain amplification of an RF signal.

One known form of multistage RF amplifier employs plural class C, common emitter (CE) transistor amplifier stages connected in parallel to amplify a common input signal, with the outputs of the plural amplifier stages being additively combined to produce a single amplified RF signal having a power level greater than any of the individual RF amplifier stages could deliver by itself. One disadvantage of this approach is that the input signal which is applied to the plural stage amplifier must have an adequate power level to drive all of the stages at the same time, since they operate in parallel.

It would be desirable to provide a multistage amplifier having reduced driving requirements, or to provide an amplifier wherein fewer stages could be used to produce a given level of power amplification. It would further be desirable to employ the amplifier stages used in the previous amplifier designs, rather than to design an entirely new amplifier module for use in such multistage amplifier embodiments.

SUMMARY OF THE INVENTION

It is an object of the present invention to provide a multistage amplifier having reduced input power requirements.

It is an additional object of the present invention to provide a multistage amplifier design employing amplifier stages which are characterized by relatively high gain and low input impedance, such as class C, common emitter transistor amplifier stages.

It is yet another object of the present invention to provide such an amplifier employing the feed-forward of power.

There is disclosed herein apparatus for interconnecting two high gain, low input impedance amplifiers to amplify RF signal so as to achieve the aforesaid goals. This apparatus comprises means for providing the RF signal to the input of one of the amplifiers such that the first amplifier provides a first amplified signal. Coupling means is provided responsive to the first amplified signal for passively coupling that signal to a combining means and also to the input of the second one of the amplifiers such that it provides a second amplified signal. The coupling means divides the power of the first amplified signal between the signals provided to the combining means and the second amplifier means such that sufficient signal drive is provided to the second amplifier and the residual power is provided to the combining means. The coupling means also has an input impedance which matches the output impedance of the first amplifier means. Combining means is provided for combining the first amplified signal provided thereto by the coupling means and the second amplified signal provided thereto by the second amplifier means to provide a combined amplified signal.

In accordance with another aspect of the present invention, apparatus is provided for amplifying an RF signal, wherein the apparatus comprises (n) amplifier means and (n−1) signal splitter means. The signal splitter means each splits an associated input signal into first and second output signals. The (n) amplifier means and (n−1) signal splitter means are connected in a cascade chain with ones of the amplifier means at the beginning and end of the chain and with the output of each of the (n) amplifier means except the last one of the chain feeding a corresponding one of the (n−1) signal splitter means. The first output of each of the signal splitter means feeds the input of the next succeeding amplifier in the chain. The apparatus further incorporates signal combining means for combining the signal provided by the last of the amplifier means and the second signals provided by the (n−1) signal splitters.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
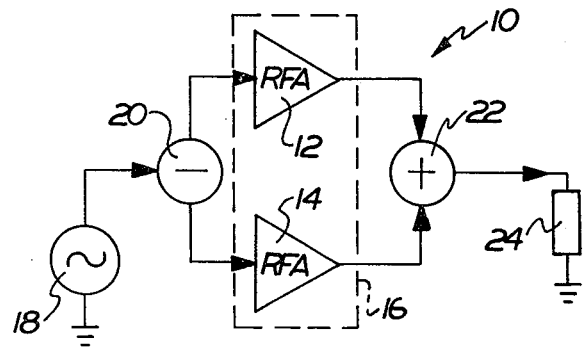
FIG. 1 is a block diagram of a prior art RF amplifier employing two RF amplifier stages.

Referring first to FIG. 1, there is illustrated a prior art RF amplifier 10 employing two RF amplifier stages 12 and 14 which together represent an amplifier module 16. In this form of prior art amplifier, the input signal, derived from a source 18, was first provided to a signal splitter 20 which divided the signal power equally between two outputs thereof, each of which was connected to an input of a corresponding one of the two RF amplifier stages 12 and 14. The outputs of the two RF amplifier stages were then combined in a signal combiner circuit 22, the output of which was connected to the load 24.

Such an amplifier as illustrated in FIG. 1 has conventionally found use in RF transmitters, wherein the input signal comprises a modulated RF carrier wave, and the load 24 represents either an antenna network or else further states of RF amplification.

Figure 3:
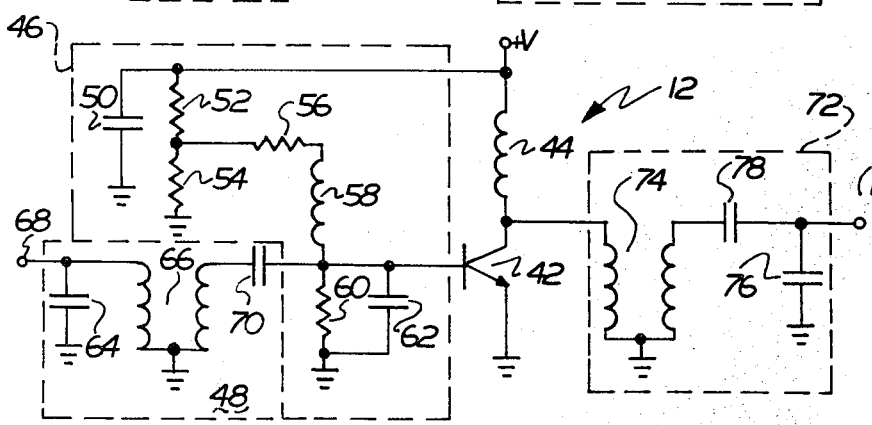
FIG. 3 is a schematic diagram of one form which the RF amplifier stages of FIG. 1 have taken and which the amplifier stages of FIG. 2 may take.

The RF amplifier stages 12 and 14 used in multi-stage amplifiers such as that shown in FIG. 1, were conventionally of the class C variety, including active transistor amplifier elements connected in a common-emitter configuration. One example of such an amplifier is illustrated in FIG. 3 and will be described hereinafter. Such amplifiers provide reasonably high gain, but require substantial input signal drive. In the example illustrated in FIG. 1, the signal source 18 provides a signal output having a power level of 20 watts, divided into two 10 watt signals by the signal splitter 20. Each of the amplifier stages 12 and 14 amplifies its 10 watt input signal to produce a 50 watt output signal, hence the signal combiner 22 provides a total of 100 watts of signal power at its output. Therefore, 20 watts of input signal power is necessary to provide 100 watts of output power. In some cases the input device 18 may not be capable of providing 20 watts of signal power, hence it may be necessary to include a third amplifier stage between the input source 18 and the signal splitter 20.

It would be desirable to reduce the input signal power level requirements of the amplifier without increasing the number of amplifier stages required.

Figure 2:
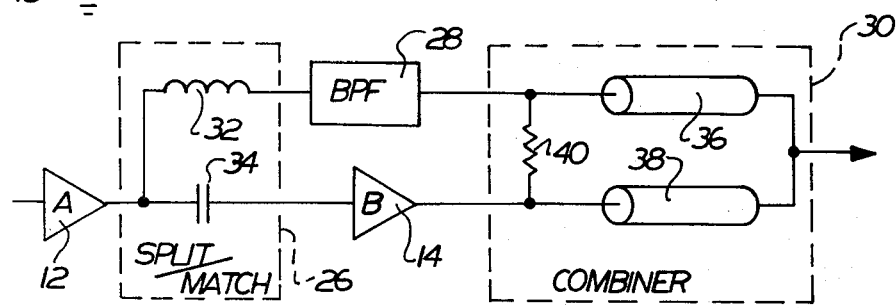
FIG. 2 is a block diagram of an RF amplifier in accordance with the teachings of the present invention, again incorporating two RF amplifier stages.

FIG. 2 illustrates an amplifier in accordance with the teachings of the present invention, wherein the arrangement of the amplifier stages is such that an input power level which is only about one-half that of prior art embodiments produces an output power level which is nonetheless similar.

In the FIG. 2 embodiment, the entire input signal is applied to the first amplifier stage 12. The output of this power amplifier stage is fed to a signal splitter/matching network 26 which divides the power level thereof between two channels: a feed forward channel and the second amplifier stage 14. The signal splitter/matching network 26 separates the signals such that sufficient signal drive is provided to the second amplifier stage 14, with the excess of the power being provided to the passive, feed forward path including the bandpass filter 28. The output of the second amplifier stage 14 is then combined with the signal which is fed forward through the bandpass filter 28 in a combiner network 30 to provide the combined output signal.

The bandpass filter (BPF) 28 is provided in the feed forward path both for delay compensation and to prevent oscillation of the amplifier. The need for delay compensation arises from the signal delay inherent in the amplifier 14. If a matching time delay were not included in the feed forward path, the signals appearing at the two combiner inputs would be slightly out of phase, leading to distortion.

A length of transmission line could be used to provide this time delay. It has been found, however, that a circuit thus arranged has a tendency to oscillate. It is therefore presently desired that a bandpass filter 28 be included having a pass band which is centered upon and broad enough to accommodate the expected frequency range of the signal to be amplified. This bandpass filter will prevent oscillations at spurious frequencies which lie outside of the passband of the filter. This bandpass filter should, of course, have a delay characteristic which is essentially equivalent to that of the amplifier stage 14 so that the signals provided at the output of bandpass filter 28 and amplifier 14 arrive at the signal combiner substantially in phase synchronism. The appropriate delay characteristic may be obtained by using either t or pi network filters, or some combination thereof, or by connecting the BPF in series with a length of transmission line selected so that the total delay is correct.

In the example illustrated in FIG. 2, 10 watts is provided to the amplifier stage 12, with the 50 watt output thereof being split such that the 10 watts is provided to the second amplifier stage 14 and the remaining 40 watts fed forward through the bandpass filter 28. The 50 watt output of the second amplifier stage 14 is then combined with the 40 watts fed forward through the bandpass filter 28 to produce a composite 90 watt output signal. Thus, in the FIG. 2 embodiment a 10 watt input signal produces a 90 watt output signal.

If the gain of the two amplifier stages is increased slightly from 5 to 5.5, then the output provided by the FIG. 2 embodiment will be 100 watts, i.e., the same as the output of the FIG. 1 embodiment. Thus, the amplifier of FIG. 2 provides reduced input signal power requirements without the inclusion of any further amplifier stages, and without substantially increasing the gain of the amplifier stages which are included.

In FIG. 2, the signal splitter/matching circuit 26 is shown as comprising a conjugate matching power divider including an inductor 32 and a capacitor 34. The values of these components are selected so that the impedance looking into the parallel combination of the two branches (i.e., the feed forward path and the second amplifier stage path) is equal to the output impedance of the first amplifier stage 12. Under this matching condition, maximum transferral of power will take place from the amplifier 12 into the downstream circuitry. The relative values of the two components 32 and 34 are selected to provide the desired power division.

The signal combiner 30 illustrated in FIG. 2 is an asymmetrical Wilkinson combiner including two sections of coaxial cable 36 and 38, with one end of the center conductors thereof being connected to the output of either bandpass filter 28 or amplifier stage 14. The other ends of the center conductors of coaxial sections 36 and 38 are joined together and represent the output of the combiner 30. A resistor 40 represents the reject load of the combiner, being connected between the two inputs thereof. The surge impedances of the transmission lines 36 and 38 are selected such that the voltages at the two ends of the resistor 40 are equalized whereby essentially no power is dissipated in this resistor, providing that the input signals to the combiner are in proper phase alignment.

As stated previously, the amplifier stages used in the prior art amplifier of FIG. 1 are high gain RF amplifiers, employing class C operation and including conventional bipolar junction transistors (BJT'S) connected in a common-emitter amplifier arrangement. These amplifiers, although having substantial input power requirements, do provide high gain and are therefore desirable for use in the amplifiers being described.

FIG. 3 illustrates the amplifier stage in greater detail. The amplifier stage 12 of FIG. 3 includes a single transistor 42 having its emitter coupled to ground, its collector connected to the output and to a positive supply through an inductor 44, and its base connected to a bias circuit 46 and an input circuit 48.

The bias circuit 46 provides a D.C. current to transistor 42 to bias it for enhanced amplification of an A.C. signal. It includes a power supply filter capacitor 50, a resistive divider comprised of two resistors 52 and 54 and a circuit for supplying the bias voltage developed at the junction of resistors 52 and 54 to the base of transistor 42, which circuit includes resistor 56, inductor 58, resistor 60 and capacitor 62. The inductor 58 is included to block RF signals from passing from the base of transistors 42 to the +V supply line. The capacitor 62 is a filter capacitor.

The input circuit 48 includes an impedance transformer for transforming the input impedance of the class C amplifier (which is very low) to an impedance which is equal to the characteristic impedance (approximately 50 ohms) of the transmission line to which it is expected that the input of this amplifier will be connected. This impedance transformer includes a capacitor 64 connected between the signal input 66 and ground and a transformer 66 whose primary is coupled to the input line 66 and whose secondary is coupled to the base of transistor 42 through a DC blocking capacitor 70.

The output impedance of the amplifier is similarly transformed by an output coupling circuit 72 such that the output impedance of the amplifier is approximately equal to the characteristic impedance (again, approximately 50 ohms) of the transmission line to which the output will be connected. The impedance transformer associated with the output circuit 72 includes transformer 74, capacitor 76 and a DC blocking capacitor 78.

It should be noted that the amplifier illustrated in FIG. 3 has high gain, but a relatively low input impedance such that the amplifier represents a substantial power drain on the signal being fed thereto. It is for this reason that the signals splitter/matching network illustrated in FIG. 2 is employed. The use of such a signal splitter/matching network permits optimum transferral of power under the conditions of substantial signal loading represented by the class C amplifier illustrated in FIG. 3.

Figure 4:
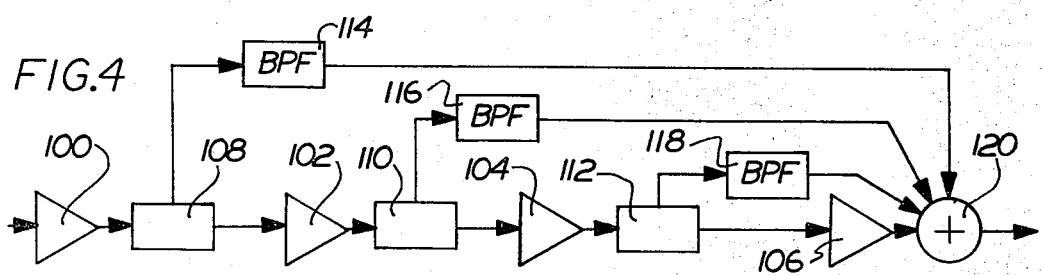
FIGS. 4 and 5 are block diagrams of other, multistage amplifiers in accordance with the teachings of the present invention.
Figure 5:
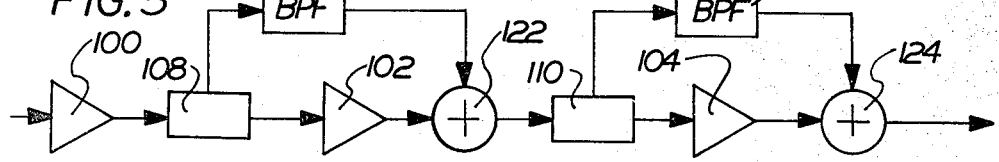

FIGS. 4 and 5 illustrate fashions in which more than two of these amplifiers stages may be coupled together to provide even greater signal gain than in the two-amplifier embodiment described above.

FIG. 4 generally illustrates an embodiment in which plural feed forward paths exist, with the power of each of these feed forward paths being combined in a single signal combiner at the output thereof. More particularly, in this embodiment plural signal amplifiers 100, 102, 104 and 106 are provided connected in cascade with signal splitter/matching networks 108, 110 and 112. The splitter/matching networks are interposed between the output of each amplifier and input of the next succeeding amplifier in order to divert that power which is not necessary to drive the succeeding amplifier past that amplifier stage to the system output, represented by a multiple input signal combiner 120. The combiner 120 adds the output signal of the last stage 106 with the signals fed forward from the preceeding stages to provide the combined power output of the circuit.

Each of these feed forward paths again includes a corresponding BPF 114, 116 or 118. The signal delays provided by circuits 114, 116 and 118 should be selected to match the amount of delay incurred in the other signal path. Thus, for example, circuit 114 should have a delay equal to the sum of the delays introduced by amplifier stages 102, 104 and 106, and signal splitters 110 and 112. To generate this time delay, it may be convenient to incorporate lengths of transmission line into the BPF's with the lengths selected to provide the appropriate delay characteristic. When the time delays are equalized, the signals arriving at the combiner 120 will be in phase synchronism with one another.

In the embodiment illustrated, each of the amplifiers is again designed to have an input power of 10 watts and a gain of 5, whereby the output signal of each amplifier again has a power of 50 watts. Each of the signal splitters has the form illustrated in FIG. 2, and divides the input signal into 10 watt and 40 watt outputs. These outputs respectively feed the next succeeding amplifier stage and the associated bandpass filter 114, 116, or 118.

An advantage of this circuit is that only a single signal combiner 120 is required to combine the signals provided by the various feed forward paths with the output of the last amplifier stage 106.

In the FIG. 5 embodiment, plural high gain amplifiers are again connected in cascade, and again signal splitters/matching networks are interposed between the output of each amplifier and the input of the next succeeding amplifier. Unlike the FIG. 4 embodiment, however, individual signal combiners 122 and 124 are provided for combining the output of each individual bandpass filter with the signal path prior to the input of the next succeeding amplifier stage. This arrangement has the advantage that, should any individual amplifier stage fail, an input signal would nonetheless be provided to the succeeding amplifier stages. In the FIG. 4 embodiment, the failure of an early amplifier stage would remove signal drive from all succeeding amplifier stages, thereby substantially reducing the signal gain of the amplifier.

Although the invention has been described with respect to preferred embodiments, it will be appreciated that various rearrangements and alterations of parts may be made without departing from the spirit and scope of the invention, as defined in the appended claims.

What is claimed is:

1. Apparatus for interconnecting two high gain, low input impedance amplifiers to amplify an RF signal, comprising:
   means for providing said RF signal to the input of a first one of said amplifiers such that said first amplifier provides a first amplified signal;
   coupling means responsive to said first amplified signal for passively coupling said signal to the input of the second one of said amplifiers such that said second amplifier provides a second amplified signal, and to a combining means; and
   combining means for combining the first amplified signal provided thereto by said coupling means and the second amplified signal provided thereto by said second amplifier means to provide a combined amplified signal;
   wherein said coupling means divides the power of said first amplified signal between the signals provided to said combining means and to said second amplifier means such that the signal provided to said second amplifier means has a first power level for providing a selected signal drive to said second amplifier means and substantially all of the residual power of said first amplified signal over and above said first power level is fed forward to the combining means, and wherein said coupling means has an input impedance which matches the output impedance of said first amplifier means.

2. Apparatus as set forth in claim 1, wherein said coupling means comprises a conjugate matching network for splitting the first amplified signal between two conjugate branches thereof, with a first branch feeding the second one of said amplifiers and a second branch feeding the residual power forward to said combining means.

3. Apparatus as set forth in claim 1, and further comprising a bandpass filter connected in the circuit between said coupling means and said combining means for bandpass filtering said feed forward signal to eliminate signal frequencies which might produce circuit oscillations and to provide a time delay in the feed forward path which matches the time delay introduced by said second amplifier.

4. Apparatus for amplifying an RF signal, comprising:
   first amplifier means responsive to an RF signal to be amplified to provide a first amplified RF signal;
   coupling means responsive to said first amplified signal for passively coupling said signal to first and second outputs thereof;

second amplifier means coupled to said first output of said coupling means for amplifying the signal provided thereby to provide a second amplified signal;

combining means responsive to said output of said second amplifier and said second output of said coupling means, for combining the signals provided thereby to provide a combined amplified signal;

wherein said second amplifier means has a relatively low input impedance and said coupling means divides the power of said first amplified signal between said first and second outputs such that a selected level of signal drive is provided to said second amplifier means and substantially all of the residual power of said first amplified signal is fed forward to the combining means and wherein said coupling means has an input impedance which matches the output impedance of said first amplifier means.

5. Apparatus as set forth in claim 4, wherein said first and second amplifier means are class C, common-emitter transistor amplifier stages.

6. Apparatus as set forth in claim 4, wherein said coupling means comprises a conjugate matching network for splitting said first amplified signal between two conjugate branches thereof, said first and second branches being connected to said first and second outputs, respectively.

7. Apparatus as set forth in claim 4, and further comprising filter means connected between said second output of said coupling means and said combining means for filtering said feed forward signal to eliminate signal frequencies which might produce circuit oscillations.

8. Apparatus as set forth in claim 7, wherein said filtering means includes means for providing a time delay in said feed forward path which substantially matches the time delay introduced by said second amplifier.

9. Apparatus for amplifying an RF signal, comprising:
(N) RF amplifier means each having an input and an output, high gain, and a low input impedance,
(N−1) RF signal splitter means for each splitting an associated input signal into first and second output signals,
means for connecting said (N) amplifier means and (N−1) signal splitter means in a cascade chain with ones of said amplifier means at the beginning and end of said chain and with the output of each of said (N) amplifier means except the last one in said chain feeding a corresponding one of said (N−1) signal splitter means and with the first output of each of said signal splitter means feeding the input of the next succeeding amplifier means in said chain, and RF signal combining means for combining the signal provided by the last of said amplifier means in said chain and the second signals provided by the (N−1) signal splitters to provide a sum signal, wherein said signal splitter means each comprises coupling means for dividing the power of the input signal provided thereto between said first and second output signals such that said first output signal has a first power level for providing a selected drive to the next succeeding amplifier means in said chain, and substantially all of the residual power of said input signal over and above said first power level is fed forward to the signal combining means, and wherein said coupling means has an input impedance which matches the output impedance of said amplifier means.

10. Apparatus as set forth in claim 9, wherein said (n) amplifier means each comprises a class C, common-emitter transistor amplifier stage.

11. Apparatus as set forth in claim 9, and further comprising (n−1) delay means, each responsive to a respective second signal provided by an associated signal splitter means for delaying said respective signal to provide a delayed signal which is phase synchronized with the output of the last of said amplifier means in said chain, said delayed second signals being provided to said combiner means whereby all signals provided to said combiner means arrive in phase synchronism with one another.

12. Apparatus for amplifying a signal, comprising:
plural amplifier sections, each including amplifier means having high gain and low input impedance for amplifying a signal to provide an amplified signal to a combining means, coupling means responsive to a signal to be amplified for passively coupling said signal to said amplifier means for amplification and to a combining means, and combining means for combining the signal provided thereto by said coupling means with the amplified signal provided thereto by said amplifier means to provide a combined amplifier signal representing the output of said amplifier unit, wherein said coupling means divides the power of said signal to be amplified between the signals provided to said combining means and to said amplifier means such that a selected level of signal drive is provided to said amplifier means and the rest of the power of said first amplified signal is fed forward to the combining means, and means for interconnecting said plural amplifier units in cascade with one another so as to form a multi-unit amplifier.

* * * * *